(12) United States Patent
Kollberg et al.

(10) Patent No.: US 10,883,171 B2
(45) Date of Patent: Jan. 5, 2021

(54) CVD REACTOR AND METHOD FOR CLEANING A CVD REACTOR

(71) Applicant: AIXTRON SE, Herzogenrath (DE)

(72) Inventors: Marcel Kollberg, Würselen (DE); Wilhelm Josef Thomas Krücken, Aachen (DE); Francisco Ruda Y Witt, Eschweiler (DE); Markus Deufel, Aachen (DE); Mike Pfisterer, Würselen (DE)

(73) Assignee: AIXTRON SE, Herzogenrath (DE)

( * ) Notice: Subject to any disclaimer, the term of this patent is extended or adjusted under 35 U.S.C. 154(b) by 49 days.

(21) Appl. No.: 16/330,747

(22) PCT Filed: Sep. 8, 2017

(86) PCT No.: PCT/EP2017/072565
§ 371 (c)(1),
(2) Date: Mar. 5, 2019

(87) PCT Pub. No.: WO2018/046650
PCT Pub. Date: Mar. 15, 2018

(65) Prior Publication Data
US 2019/0226082 A1 Jul. 25, 2019

(30) Foreign Application Priority Data

Sep. 9, 2016 (DE) .......... 10 2016 116 953
Jan. 16, 2017 (DE) .......... 10 2017 100 725

(51) Int. Cl.
*C23C 16/455* (2006.01)
*C23C 16/44* (2006.01)
(Continued)

(52) U.S. Cl.
CPC .......... *C23C 16/4405* (2013.01); *C23C 16/18* (2013.01); *C23C 16/4404* (2013.01); *C23C 16/45572* (2013.01); *C23C 16/303* (2013.01)

(58) Field of Classification Search
CPC . C23C 16/4404; C23C 16/4405; C23C 16/18; C23C 16/45572
See application file for complete search history.

(56) References Cited

U.S. PATENT DOCUMENTS 6,060,397 A 5/2000 Seamons et al.
6,524,402 B1 * 2/2003 Broutin ............ B01J 19/02
148/240

(Continued)

FOREIGN PATENT DOCUMENTS

CN 101903984 A * 12/2010 .......... H01L 21/302
DE 102013104105 A1 10/2014
(Continued)

OTHER PUBLICATIONS

Dhaka, Veer, et al., "Protective capping and surface passivation of III-V nanowires by atomic layer deposition". AIP Advances 6, 015016 (2016) pp. 1-7. https://doi.org/10.1063/1.4941063.*
(Continued)

*Primary Examiner* — Bret P Chen
(74) *Attorney, Agent, or Firm* — Ascenda Law Group, PC

(57) ABSTRACT

A CVD reactor includes a gas inlet element for introducing a process gas into a process chamber arranged between a process chamber cover and a susceptor. The gas inlet element contains at least one metal surface that comes into contact with the process gas. The metal surface has a passivation layer which prevents the metal surface from flaking due to exposure to one or more reactive gases. Cooling channels are arranged such that the passivation layer is maximally heated to 100° C. in a cleaning step in which chlorine is introduced into the process chamber and
(Continued)

the susceptor is heated to at least 700° C. At the same time, the passivation layer is formed by chemically reacting a metal-organic compound with the metal atoms of the metal surface. The cleaning gas inlet openings are arranged such that the cleaning gas comes into contact with the metal surface that has the passivation layer.

12 Claims, 1 Drawing Sheet

(51) Int. Cl.
*C23C 16/18* (2006.01)
*C23C 16/30* (2006.01)

(56) References Cited

U.S. PATENT DOCUMENTS

| | | | |
|---|---|---|---|
| 2001/0006070 A1 | 7/2001 | Shang et al. | |
| 2002/0029748 A1* | 3/2002 | Kuwada | C23C 16/45572 118/724 |
| 2004/0011380 A1* | 1/2004 | Ji | B08B 7/0035 134/1.1 |
| 2005/0016458 A1 | 1/2005 | Zhang et al. | |
| 2008/0276958 A1* | 11/2008 | Mehta | B08B 7/0035 134/1.2 |
| 2010/0018554 A1* | 1/2010 | Enicks | B08B 7/0071 134/21 |
| 2010/0229794 A1 | 9/2010 | Iso et al. | |
| 2011/0162674 A1 | 7/2011 | Tang et al. | |
| 2012/0093492 A1* | 4/2012 | Kato | F27B 17/0025 392/411 |
| 2012/0171797 A1 | 7/2012 | Kang et al. | |
| 2013/0005118 A1 | 1/2013 | Jun et al. | |
| 2015/0083212 A1* | 3/2015 | Beck | H01L 31/0749 136/256 |
| 2015/0137318 A1* | 5/2015 | Osada | H01L 21/02463 257/615 |
| 2015/0218695 A1* | 8/2015 | Odedra | C23C 14/564 134/1.1 |
| 2016/0020071 A1 | 1/2016 | Khaja et al. | |

FOREIGN PATENT DOCUMENTS

| | | |
|---|---|---|
| DE | 102015101462 A1 | 8/2016 |
| DE | 102016118345 A1 | 2/2018 |
| WO | 2013/033428 A2 | 3/2013 |

OTHER PUBLICATIONS

Ravillon, Sandrine, et al., "Gas phase chlorination of hydrogen-passivated silicon surfaces". Applied Physics Letters, vol. 85, No. 13, Sep. 27, 2004, pp. 2583-2585.*

Lelievre, Jean-Francois, et al., "Efficient silicon nitride SiNx:H antireflective and passivation layers deposited by atmospheric pressure PECVD for silicon solar cells". Prog Photovolt Res Appl. 2019, 27, 1007-1019.*

Leguijt, C., et al., "Low temperature surface passivation for silicon solar cells". Solar Energy Materials and Solar Cells 40 (1996) 297-345.*

Written Opinion dated Dec. 1, 2017, from the ISA/European Patent Office, for International Application No. PCT/EP2017/072565, 9 pages. (English translation).

International Preliminary Report on Patentability dated Mar. 12, 2019, from the International Bureau of WIPO, for International Application No. PCT/EP2017/072565, 10 pages.

International Preliminary Report on Patentability dated Mar. 12, 2019, from the International Bureau of WIPO, for International Application No. PCT/EP2017/072565, 8 pages. (English translation).

International Search Report dated Dec. 1, 2017, from the ISA/European Patent Office, for International Application No. PCT/EP2017/072565, 7 pages.

Written Opinion dated Dec. 1, 2017, from the ISA/European Patent Office, for International Application No. PCT/EP2017/072565, 9 pages.

* cited by examiner

CVD REACTOR AND METHOD FOR CLEANING A CVD REACTOR

RELATED APPLICATIONS

This application is a National Stage under 35 USC 371 of and claims priority to International Application No. PCT/EP2017/072565, filed 8 Sep. 2017, which claims the priority benefit of DE Application No. 10 2016 116 953.6, filed 9 Sep. 2016 and DE Application No. 10 2017 100 725.3, filed 16 Jan. 2017.

FIELD OF THE INVENTION

The invention pertains to a CVD reactor with a susceptor, which can be heated by a heating device and serves for receiving one or more substrates to be coated, and with a gas inlet element for introducing a process gas into a process chamber arranged between a process chamber ceiling and the susceptor, wherein the gas inlet element contains at least one metal component, particularly a special steel component, which has at least one metal surface, particularly a special steel surface, that comes in contact with the process gas and comprises at least one cooling channel for cooling the gas inlet element, at least one process gas inlet opening, which is supplied by a process gas supply line and serves for introducing the process gas containing one or more reactive gases into the process chamber, and a cleaning gas inlet opening, which is supplied by a cleaning gas supply line and serves for introducing a cleaning gas into the process chamber.

The invention furthermore pertains to a method for cleaning a process chamber of a CVD reactor, in which deposits on the surface of a susceptor, which are formed during at least one first deposition step due to the introduction of at least one first reactive gas into the process chamber, are in a cleaning step, in which a cleaning gas is introduced into the process chamber, converted into volatile components due to a chemical reaction with the cleaning gas at a first temperature that is an elevated temperature, wherein said volatile components are transported out of the process chamber by means of a carrier gas, and wherein the process chamber comprises at least one special steel component, which has at least one metal surface, particularly a special steel surface, that comes in contact with the process gas, at least one cooling channel for cooling the gas inlet element, at least one process gas inlet opening, which is supplied by a process gas supply line and serves for introducing one or more reactive gases into the process chamber, and a cleaning gas inlet opening, which is supplied by a cleaning gas supply line and serves for introducing a cleaning gas into the process chamber.

BACKGROUND

DE 10 2015 101 462 A1 discloses a CVD reactor, in which a metallo-organic compound of the main group III and a hydride of the main group V are separately introduced into a process chamber by means of a gas inlet element. The process chamber has a base that is formed by a susceptor with substrates lying thereon, wherein said substrates are coated with reaction products of the two process gases, for example with GaN or other III-V semiconductor layers. In this case, the process gases decompose on hot surfaces within the process chamber and therefore not only on the substrates, but also on the intermediate spaces remaining between the substrates. The deposits being formed at these locations have to be removed from time to time, particularly after each production cycle. To this end, a cleaning gas is introduced into the process chamber through a separate gas inlet opening. The cleaning gas preferably consists of chlorine, which is introduced into the process chamber together with nitrogen. In the process chamber, the deposits are converted into volatile chemical compounds with the aid of the etching gas at elevated temperatures, e.g., at temperatures above 600° C., wherein said volatile chemical compounds are removed from the process chamber by means of the carrier gas.

Non-prepublished patent DE 10 2016 114 183 describes a method for providing the surface of special steel components within a process chamber with a passivation layer by acting upon these special steel components with a metallo-organic compound and subsequently with ambient air. This passivation layer has the property of preventing the release of metal atoms from the special steel surface during a deposition step and their incorporation into the layer to be deposited. The passivation layer is removed during the cleaning step, in which the special steel components are also heated to an elevated temperature, such that it has to be reapplied after the cleaning step. This is considered disadvantageous.

The relevant prior art furthermore includes patent WO 2013/033428 A2, in which a cleaning method for cleaning the process chamber of a MOCVD reactor is described. In this case, a cleaning plate is placed against a gas inlet element in the form of a showerhead. An annular gap should thereby be produced, wherein a gas flows through said annular gap such that a diffusion barrier is formed and the cleaning gas is prevented from coming in contact with the gas outlet surface of the showerhead.

U.S. Pat. No. 6,060,397 describes a method for cleaning the process chamber of a CVD reactor by using $N_2$, $C_2F_6$ and $O_2$, wherein a plasma is generated from these cleaning gases by means of a plasma generator.

US 2011/0162674 A1 describes a method for removing TiN residues from a process chamber of a CVD reactor. In this case, chlorine is used as cleaning gas and activated into an etching plasma by means of a plasma generator.

US 2012/0171797 A1 describes a device and a method for depositing GaN or AlGaN layers for the manufacture of light-emitting diodes. Cyclopentadienylmagnesium is used as doping material.

US 2013/0005118 A1 describes a method for depositing III-V layers by using a MOCVD reactor, which is cleaned after a deposition step by introducing chlorine, wherein the process chamber is cleaned at elevated temperatures.

US 2016/0020071 discloses an ALD method, in which different gases are alternately introduced into a process chamber, wherein only one monolayer is respectively deposited on a substrate. Two successively deposited and different monolayers are intended to react with one another. A metal surface of the process chamber should also be passivated with this method, wherein an organic starting material containing aluminum is initially introduced into the process chamber and an oxygen donor is subsequently introduced into the process chamber such that aluminum oxide is formed in a reaction.

SUMMARY OF THE INVENTION

The invention is based on the objective of enhancing the known cleaning method for cleaning a CVD reactor for use in MOCVD reactors, in which metal surfaces exposed to the cleaning gas were in a conditioning step provided with a passivation layer, as well as of disclosing a suitable CVD reactor for this method.

This objective is attained with the invention specified in the claims, wherein the dependent claims not only represent advantageous enhancements of the coordinate claims, but also independent solutions.

In the CVD reactor used in accordance with the invention, the metal surfaces that come in contact with the process gas are provided with a passivation layer. A metal surface without passivation layer has on its surface metal atoms, which can come in relative contact with one of the reactive gases, such that these metal atoms are detached. This is prevented with the passivation layer. The metal component particularly is made of an alloy that consists of multiple metallic elements. The alloy particularly contains iron. The alloy particularly is special steel. A special steel surface, which is not provided with a passivation layer, has on its surface iron atoms, as well as chromium atoms. In a few metallo-organic compounds used in the deposition of III-V layers and particularly doped III-V layers, a chemical reaction of the metallo-organic compound which the local metal atoms takes place on the metal surface, particularly the special steel surface, wherein metal atoms detach from the surface in said reaction and reach the gas phase within the process chamber in the form of a metallo-organic compound. The metal, particularly iron, which is thusly detached from the surface of the alloy, particularly the special steel surface, can be undesirably incorporated into the layer to be deposited on the substrate. According to the invention, the metal components or special steel components, which come in contact with the process gas, are therefore provided with a passivation layer that at least impedes this detachment. In a preferred method for passivating the metal surface, particularly the special steel surface, the untreated yet cleaned special steel surface is acted upon with a metallo-organic gaseous compound for a certain treatment period. An exchange of the metal atoms with the metal atoms, particularly iron atoms, of the metallo-organic compound, which preferably consists of $Cp_2Mg$, takes place during this first treatment period. In a second step, the thusly pretreated metal surface, particularly special steel surface, is exposed to the ambient air such that magnesium oxide, magnesium hydroxide or magnesium carbonate can form on the surface. In order to prevent etching of this passivation layer while the susceptor is cleaned, the gas inlet element is cooled in such a way that the metal components, particularly the special steel components, which are exposed to the cleaning gas, exceed a maximum temperature. Instead of using such a particularly metallo-organic passivation layer or a passivation layer consisting of oxides, it is also proposed to coat the metal surface with a metal layer, particularly to nickel-plate or chromium-plate the metal surface. The metal coating may be applied galvanically. However, it may also be applied by means of vapor coating. The coating preferably consists of chromium or nickel. However, the coating may also consist of a precious metal. The metal components, particularly the special steel components, provided with a passivation layer preferably reach a maximum temperature of 100° C., particularly a maximum temperature of 70° C. The cleaning step takes place at temperatures of at least 600° C. The process chamber preferably is heated to at least 700° C. during the cleaning step. In an inventive CVD reactor, the gas inlet element has at least one metal component, particularly one special steel component. The metal component, particularly the special steel component, may have a surface that is electropolished. The surface preferably is smoothed during electropolishing such that the effective size of the surface is reduced. The metal component, particularly the special steel component, comprises a cooling channel for cooling the gas inlet element and has a surface that faces the process chamber. The surface of the metal component, particularly the special steel component, facing the process chamber contains process gas inlet openings for introducing one or more reactive gases into the process chamber, wherein said reactive gases serve as starting materials for the deposition of the aforementioned III-V layers. The metal component, particularly the special steel component, furthermore comprises a cleaning gas inlet opening for introducing a cleaning gas into the process chamber. The cleaning gas may consist of chlorine. However, it may also consist of a gas, the molecules of which comprise a halogen. The one or more process gas inlet openings are connected to one or more process gas supply lines such that the different process gases can be separately introduced into the process chamber and only intermix within the process chamber. The gas inlet element may be arranged in the center of a process chamber, which is realized rotationally symmetrical about an axis, such that the process gases move through the process chamber in the radial direction. The gas inlet element comprises vertically extending gas discharge openings for discharging the process gases. The process gas exiting the gas inlet element flows through the process chamber between two walls, wherein one wall is formed by a susceptor, which essentially lies in a horizontal plane, and a wall extending parallel thereto is formed by a process chamber ceiling. The cleaning gas is introduced through cleaning gas inlet openings that preferably are assigned to the process chamber ceiling. The cleaning gas inlet openings may be arranged in uniform circumferential distribution about the gas inlet element, wherein the annular zone, in which the cleaning gas inlet openings are arranged, may lie directly adjacent to the gas inlet element. A directed cleaning gas flow preferably flows from the cleaning gas inlet openings into the process chamber. To this end, the cleaning gas inlet openings or an axis through a cleaning gas inlet opening, which defines the flow direction, is angled relative to another axis extending transverse to the flow direction, wherein the angle between the two axes lies between 0 and 60 degrees. The cleaning gas flow exiting the cleaning gas inlet openings therefore has a flow direction component, which extends away from the gas inlet element. If the process gas flow exiting the gas inlet element is directed horizontally, the cleaning gas inlet opening is inclined relative to a vertical axis by 0 to 60 degrees, wherein the angle of inclination preferably is greater than 0 degrees and chosen such that the formation of turbulences, which transport the cleaning gas back in the direction of the gas inlet element, is prevented as far as possible. However, the gas inlet element may also be realized in the form of a showerhead. In this case, the gas inlet element forms the process chamber ceiling and comprises a plurality of gas inlet openings, which are uniformly arranged on the process chamber ceiling and through which one or more process gases can be introduced into the process chamber. In both instances, the at least one cooling channel is arranged in such a way and a coolant flows through said cooling channel in such a way that the surface of the gas inlet element facing the process chamber does not become hotter than 100° C. The passivation layer, which preferably has a maximum thickness of 3 nm, is applied in at least one conditioning step, wherein each conditioning step comprises two partial steps, namely a first partial step, in which the metallo-organic compound is introduced together with a carrier gas, and a second partial step, in which air or an air-like gas mixture is introduced into the process chamber or the process chamber is merely opened such that air or an air-like gas mixture can act upon the metal component, particularly the special steel component. A flushing step may be carried out between each of these partial steps. The individual conditioning steps of the plurality of conditioning steps also may be respectively separated from one another in time by a flushing step. While the metal surface, particularly the special steel surface, is acted upon with the metallo-organic compound in order to be conditioned, the surface may be heated to a temperature of more than 40° C. However, not only alloys such as special steel, but also other alloys, particularly alloys containing iron, as well as alloys suitable for use in a CVD reactor, e.g. nonferrous metal alloys such as bronze, brass or the like, may be considered as metals for the metal component. According to an enhancement of the invention, the passivation layer can also be produced simultaneously with the cleaning step, i.e. simultaneously with the introduction of chlorine. An already existing passivation layer can furthermore be stabilized during the cleaning step. The cleaning gas inlet openings are arranged in such a way that the cleaning gas respectively comes in contact with the metal surface or the passivation layer during the cleaning step. However, no chemical reaction with the passivation layer takes place. The passivation layer is produced concomitant with a chemical reaction of a metallo-organic component with the metal surface.

BRIEF DESCRIPTION OF THE DRAWINGS

An exemplary embodiment of the invention is described below with reference to the attached drawings. In these drawings.

DETAILED DESCRIPTION

Figure 1:
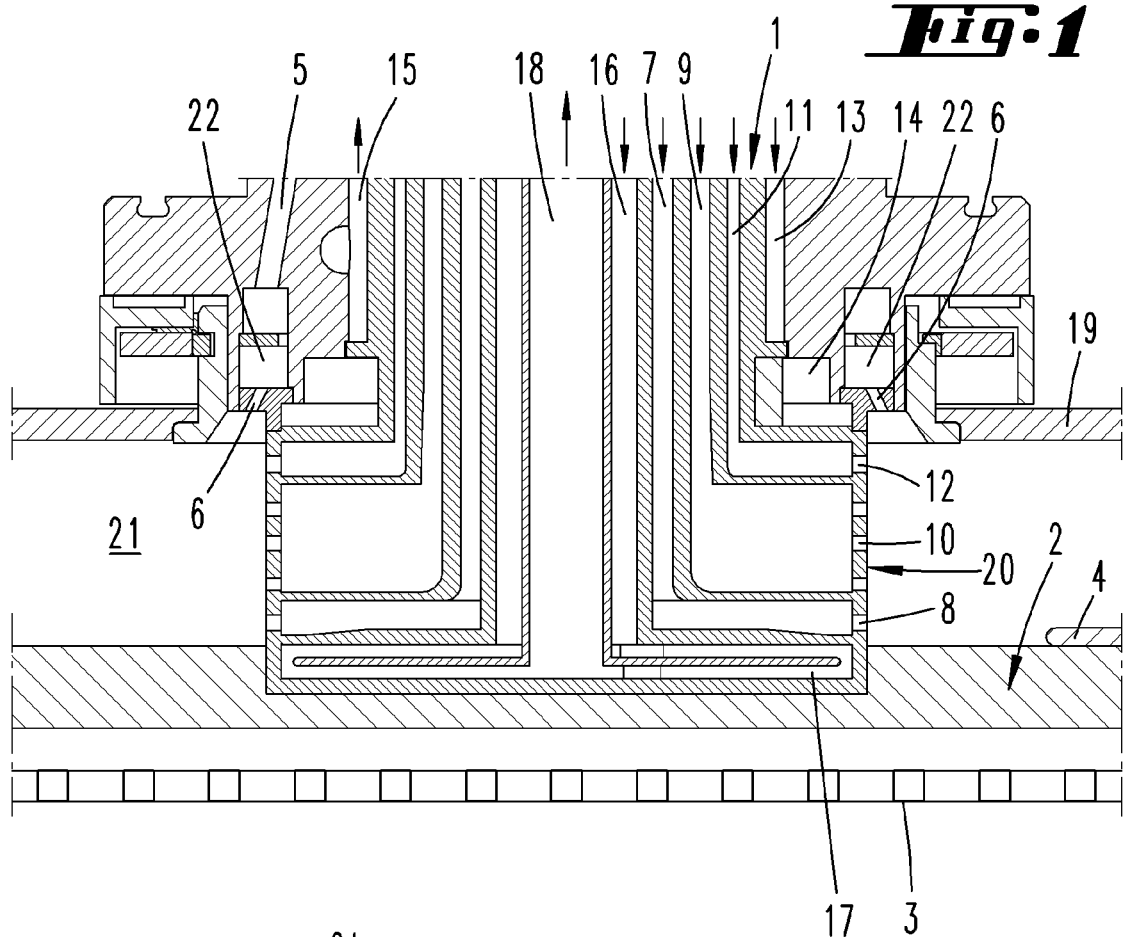
FIG. 1 shows a partial section through a CVD reactor.

A CVD reactor of the above-described type is basically known from DE 10 2015 101 462 A1 and the literature cited therein.

The CVD reactor comprises an outwardly gas-tight housing, which can be evacuated by means of a vacuum pump. A process chamber 21 is located within the housing. The process chamber 21 has a process chamber base that is formed by a susceptor 2 consisting of coated graphite. A plurality of substrates 4 are placed on the susceptor 2 and coated with a III-V layer, e.g. of GaN, in a CVD process.

A heater 3 is located underneath the susceptor 2 and heats the surface of the susceptor 2 facing the process chamber 21 to process temperatures, which may lie in the range between 700° C. and 1200° C.

A gas inlet element 1 is located in the center of the process chamber 21 and comprises special steel components. The gas inlet element 1 consists of an essentially cylindrical body with gas inlet openings, 8, 10, 12, which are arranged on the cylinder wall and serve for introducing different reactive gases, e.g. metallo-organic compounds and hydrides, from the interior of the gas inlet element 1 into the process chamber 21 surrounding the gas inlet element 1. A gas inlet opening 8 leading into the process chamber 21 directly above the susceptor 2 is supplied by a process gas supply line 7. An inlet opening 12 arranged directly underneath the process chamber ceiling 19 is supplied by a process gas supply line 11. Intermediate gas inlet openings 10 are applied by a process gas supply line 9. The outer surface of the section of the gas inlet element 1, which comprises the process gas inlet openings, 8, 10, 12, is a special steel surface that is provided with a passivation layer. The passivation layer is applied prior to the first CVD step.

A cooling chamber 17 is located underneath the process gas inlet opening 8 and supplied with a coolant such as water through a coolant supply line 16, wherein said coolant is discharged from the cooling channel 17 through a coolant discharge line 18.

The cooling channel 17 is arranged in the region of the susceptor 2 whereas an additional cooling channel 14 is arranged in the region of the process chamber ceiling 19. This cooling channel 14 is supplied by a coolant supply line 13. The coolant exits the cooling channel 14 through a coolant discharge line 15.

A device for introducing a cleaning gas is provided in the region of the process chamber ceiling 19 in a peripheral arrangement referred to the process gas inlet openings, 8, 10, 12, which are arranged on a cylindrical surface. An annular cleaning gas distribution chamber 22 is supplied by a cleaning gas supply line 5. The cleaning gas can flow from the annular chamber into the process chamber 21 through cleaning gas inlet openings 6. The cleaning gas inlet openings 6 are arranged in the region of the process chamber ceiling 19. The cleaning gas inlet openings 6 lie in a circular zone that directly borders on the gas inlet element 1. The cleaning gas inlet openings 6 generate a directed gas flow into the process chamber 21, wherein this gas flow has a flow direction component that extends away from the gas inlet element 1. The susceptor 2 and the process chamber ceiling 19 extend in a common plane, particularly a horizontal plane. In this case, the surface normal to this plane may be a vertical axis. The cleaning gas inlet openings 6 have an axis that extends at an acute angle to the surface normal, i.e. preferably to the vertical axis. The angle between the axis of the cleaning gas inlet opening 6 and this axis, which extends transverse to the flow direction of the process gas exiting the gas inlet element 1, lies between 0 and 60 degrees. A preferred angle lies at 25 degrees. The cleaning gas inlet openings, 6, which are arranged in uniform angular distribution about a center axis of the process chamber, preferably generate flows that exit a gas outlet zone of the process chamber ceiling along an imaginary frustoconical surface.

The special steel surfaces of the gas inlet element 1 are passivated prior to the first-time operation of the gas inlet element 1. If the process chamber contains other special steel surfaces that can come in contact with one of the process gases, these special steel surfaces are likewise passivated. The passivation may be realized in the form of a coating. The coating may consist of a metal coating such as a chromium coating or a nickel coating. The metal component 20 may therefore be chromium-plated or nickel-plated. The special steel surface may be electropolished in order to make it more resistant to the aggressive chlorine. A preferred method for producing a passivation layer is described below:

The passivation is realized by introducing a metallo-organic compound such as magnesocene into the process chamber 21 in a first step such that magnesocene comes in contact with the special steel surface. In a second step, which is carried out after the process chamber 21 has been flushed, ambient air is introduced into the process chamber or the process chamber is opened such that ambient air can come in contact with the special steel surface. This sequence of steps is repeated several times, namely with a respective intermediate flushing step, until a sufficiently thick or sufficiently closed passivation layer is formed. No substrates 4 are located in the process chamber 21 during the conditioning.

The substrates 4 are introduced into the process chamber 21 after the conditioning. Subsequently, a III-V layer sequence is conventionally deposited on the substrates 4.

The process chamber is cleaned after the completion of the deposition process and the removal of the substrates 4 from the process chamber 21.

Figure 2:
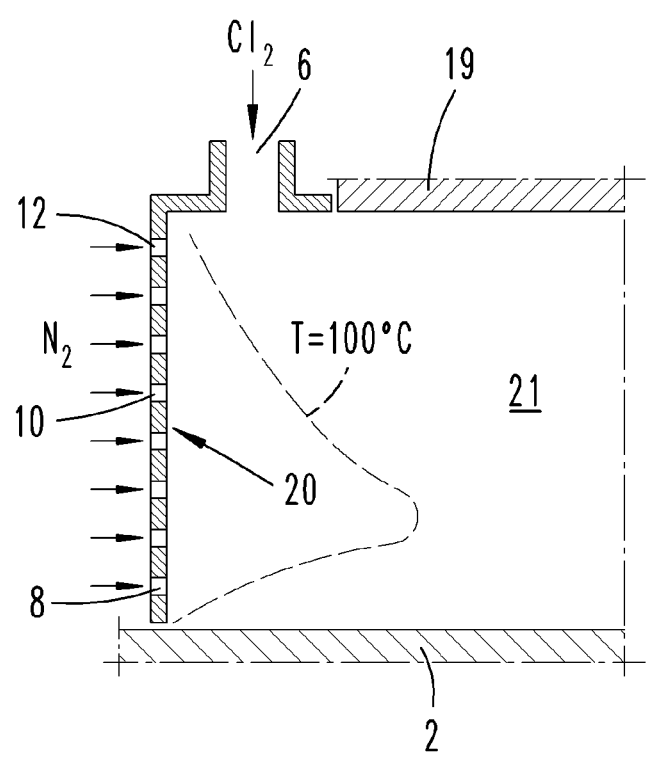
FIG. 2 likewise shows a partial section and a 180° isothermal line during a cleaning step drawn therein.

In order to clean the process chamber 21, a mixture of chlorine and nitrogen is introduced into the process chamber 21 through the cleaning gas supply line 5 and the cleaning gas inlet opening 6. The heating device 3 heats the susceptor 2 to an elevated first temperature, which amounts to at least 700° C. The surface of the metal component 20 facing the process chamber 21, i.e. the surface area of the gas inlet element 1, is cooled to a temperature that amounts to no more than 100° C., preferably no more than 70° C., by means of the cooling liquid that is introduced into the cooling channels 14, 17 and preferably consists of water. Nitrogen or another inert gas is conveyed through the process gas supply lines 7, 9, 11 and flows into the process chamber 21 through the associated process gas inlet openings, 8, 10, 12. The isothermal line, which is illustrated in the form of a broken line in FIG. 2 and in which the gas phase temperature amounts to 100° C., is formed due to the resulting vertical flow profile.

The chlorine exiting the cleaning gas inlet opening 6 and the inert gas used in fact come in contact with the surface of the metal component 20. However, no reaction of the cleaning gas with the applied passivation layer takes place because the surface temperature of the metal component 20 is lower than 100° C.

The volatile metal chlorides contained in the gas phase during the cleaning step can also contribute to the production or to the stabilization of the passivation layer.

However, the surface of the susceptor 2 facing the process chamber 21 has a sufficiently high temperature such that the cleaning gas can chemically react with the deposits at this location and form volatile components, which are transported away with the carrier gas.

The surfaces of the metal component 20 are located between two cooled sections of the process chamber 21 in order to generate a suitable temperature profile, in which the surface temperature of the metal component 20 is sufficiently low during the cleaning step, in the process chamber 21. In this case, one cooled section is locally assigned to the susceptor 2. Another cooled section is locally assigned to the process chamber ceiling 19. The metal component 20 particularly comprises a first end section, which is cooled by a first cooling device, and a second section, which preferably is also an end section and likewise cooled. A gas inlet surface containing a plurality of gas inlet openings, 8, 10, 12 extends between the two cooled sections, wherein the gas inlet openings, 8, 10, 12 may be arranged on a cylindrical surface or on a circular disk surface.

The preceding explanations serve for elucidating all inventions that are included in this application and respectively enhance the prior art independently with at least the following combinations of characteristics, namely:

A CVD reactor, which is characterized in that at least one metal surface comprises a passivation layer that impedes a detachment of the metal constituents of the metal surfaces by one or more reactive gases, and in that the cooling channels 14, 17 are arranged in such a way that the passivation layer is heated to a second temperature of no more than 100° C. during a cleaning step, in which a cleaning gas is introduced into the process chamber 21 and the susceptor 2 is heated to a first temperature of at least 700° C.

A method, which is characterized in that a passivation layer is formed on the metal surface in a conditioning step that is carried out prior to the first deposition step, wherein said passivation layer prevents a detachment of metal constituents from the metal surface by the at least one reactive gas, and in that the metal surface is during the cleaning step cooled to a second temperature, which is lower than the first temperature and at which the cleaning gas does not react with the passivation layer in such a way that the effect of the passivation layer is impaired.

A CVD reactor or a method, which are characterized in that the first temperature amounts to at least 700° C.

A CVD reactor or a method, which are characterized in that the second temperature is lower than 100° C. or lower than 70° C.

A CVD reactor or a method, which are characterized in that the second temperature is higher than 20° C.

A CVD reactor or a method, which are characterized in that the cleaning gas contains an element of the main group VII or consists of chlorine.

A CVD reactor or a method, which are characterized in that the passivation layer has a layer thickness of <3 nm.

A CVD reactor or a method, which are characterized in that the metal component 20 consists of a metal alloy.

A CVD reactor or a method, which are characterized in that the metal component 20 is a special steel component, the metal surface is a special steel surface and the metal constituents are iron constituents.

A CVD reactor or a method, which are characterized in that the passivation layer is produced in a conditioning step, in which a metallo-organic compound is initially introduced into the process chamber 21 together with a carrier gas for a first treatment period and a gas or gas mixture containing oxygen, water vapor and/or carbon dioxide is subsequently brought in contact with the metal component for a second treatment period.

A CVD reactor or a method, which are characterized in that a metallo-organic compound in the form of $Cp_2Mg$ and air are used for producing the passivation layer.

A CVD reactor or a method, which are characterized in that the passivation layer is a coating, particularly a metal coating that preferably consists of nickel or chromium.

A CVD reactor or a method, which are characterized in that the surface of the metal component (20) is electropolished and particularly is an electropolished special steel surface.

A CVD reactor or a method, which are characterized in that the cleaning gas inlet openings (6) are inclined relative to an axis extending transverse to the flow direction, particularly a vertical axis, by an angle (a) between 0 and 60 degrees, preferably 25 degrees.

All disclosed characteristics are essential to the invention (individually, but also in combination with one another). The disclosure content of the associated/attached priority documents (copy of the priority application) is hereby fully incorporated into the disclosure of this application, namely also for the purpose of integrating characteristics of these documents into claims of the present application. The characteristic features of the dependent claims characterize independent inventive enhancements of the prior art, particularly for submitting divisional applications on the basis of these claims.

LIST OF REFERENCE SYMBOLS

1 Gas inlet element
2 Susceptor

3 Heating device
4 Substrate
5 Cleaning gas supply line
6 Cleaning gas inlet opening
7 Process gas supply line
8 Process gas inlet opening
9 Process gas supply line
10 Process gas inlet opening
11 Process gas supply line
12 Process gas inlet opening
13 Coolant supply line
14 Cooling channel
15 Coolant discharge line
16 Coolant supply line
17 Cooling channel
18 Coolant discharge line
19 Process chamber ceiling
20 Metal component
21 Process chamber
22 Cleaning distribution chamber
α Angle

What is claimed is:

1. A method for cleaning a process chamber (21) of a chemical vapor deposition (CVD) reactor, the CVD reactor comprising (i) a susceptor (2) for receiving one or more substrates (4) to be coated, (ii) the process chamber (21), (iii) a gas inlet element (1) for introducing a process gas into the process chamber (21), wherein the gas inlet element (1) contains at least one metal component (20) that has a metal surface that comes in contact with the process gas, (iv) at least one cooling channel (14, 17) for cooling the gas inlet element (1), (v) at least one process gas inlet opening (8, 10, 12) for introducing the process gas containing at least one reactive gas into the process chamber (21), wherein the at least one process gas inlet opening (8, 10, 12) is supplied by a process gas supply line (7, 9, 11), and (vi) a cleaning gas inlet opening (6) for introducing a cleaning gas into the process chamber (21), wherein the cleaning gas inlet opening (6) is supplied by a cleaning gas supply line (5), the method comprising:

introducing, in a cleaning step, a cleaning gas into the process chamber (21) so as to convert deposits on a surface of the susceptor (2) into volatile components due to a chemical reaction of the deposits with the cleaning gas at a first temperature, wherein the deposits are formed during at least one deposition step due to an introduction of the at least one reactive gas into the process chamber (21); and transporting the volatile components out of the process chamber (21) by means of a first carrier gas, wherein a passivation layer is formed on the metal surface in a conditioning step that is carried out prior to the at least one deposition step, wherein the passivation layer prevents a detachment of metal constituents from the metal surface by the at least one reactive gas, wherein the metal surface is, during the cleaning step, cooled to a second temperature that is lower than the first temperature and at which the cleaning gas comes in contact with the passivation layer, but not react with the passivation layer in such a way that an effect of the passivation layer is impaired, and wherein the passivation layer is produced concomitant with a chemical reaction of a metallo-organic compound with metal atoms of the metal surface.

2. The method of claim 1, wherein the first temperature is at least 700° C.

3. The method of claim 1, wherein the second temperature is lower than 100° C.

4. The method of claim 1, wherein the cleaning gas contains an element of main group VIII or consists of chlorine.

5. The method of claim 1, wherein a thickness of the passivation layer is less than 3 nm.

6. The method of claim 1, wherein the metal component (20) consists of a metal alloy.

7. The method of claim 1, wherein the metal component (20) is a steel component, the metal surface is a steel surface and the metal constituents are iron constituents.

8. The method of claim 1, wherein the passivation layer is produced in a conditioning step, in which the metallo-organic compound is initially introduced into the process chamber (21) together with a second carrier gas for a first treatment period and a gas or gas mixture containing oxygen, water vapor and/or carbon dioxide is subsequently brought in contact with the metal component for a second treatment period.

9. The method of claim 8, wherein air and the metallo-organic compound in a form of $Cp_2Mg$ are used for producing the passivation layer.

10. The method of claim 1, wherein the passivation layer is stabilized simultaneously with the cleaning step.

11. The method of claim 1, wherein the passivation layer is a metal coating of nickel or chromium.

12. The method of claim 1, wherein the surface of the metal component (20) is electropolished and/or an electropolished steel surface.

* * * * *